United States Patent [19]

McCollum

[11] 4,352,236
[45] Oct. 5, 1982

[54] DOUBLE FIELD OXIDATION PROCESS

[75] Inventor: John L. McCollum, Portland, Oreg.

[73] Assignee: Intel Corporation, Santa Clara, Calif.

[21] Appl. No.: 286,578

[22] Filed: Jul. 24, 1981

[51] Int. Cl.³ ............................................. H01L 21/22
[52] U.S. Cl. .................................. 29/571; 29/576 W; 29/577 C; 148/187
[58] Field of Search ................ 29/571, 577 C, 576 W; 148/187

[56] References Cited

U.S. PATENT DOCUMENTS

| 3,996,658 | 12/1976 | Takei et al. | 29/571 |
| 4,031,608 | 6/1977 | Togei et al. | 29/571 X |
| 4,164,751 | 8/1979 | Tasch | 29/571 X |
| 4,218,267 | 8/1980 | Maddox | 148/1.5 |
| 4,258,466 | 3/1981 | Kuo et al. | 29/571 |
| 4,282,648 | 8/1981 | Yu et al. | 29/576 W |
| 4,313,253 | 2/1982 | Henderson | 29/571 |
| 4,319,260 | 3/1982 | Tasch | 29/571 X |
| 4,322,881 | 4/1982 | Enomoto et al. | 148/1.5 X |
| 4,326,329 | 4/1982 | McElroy | 148/187 X |

Primary Examiner—G. Ozaki
Attorney, Agent, or Firm—Blakely, Sokoloff, Taylor & Zafman

[57] ABSTRACT

A process for growing field oxide particularly for a dynamic memory is described. The process results in thinner field oxides in the storage array (2000-3000 A) and thicker oxides for the peripheral circuits (7000-8000 A). The thinner field oxide regions have smaller birdbeaks, reducing required substrate area. The plate for the storage nodes are coupled to ground potential, thus the thinner field oxides in the storage region provide sufficient isolation.

12 Claims, 8 Drawing Figures

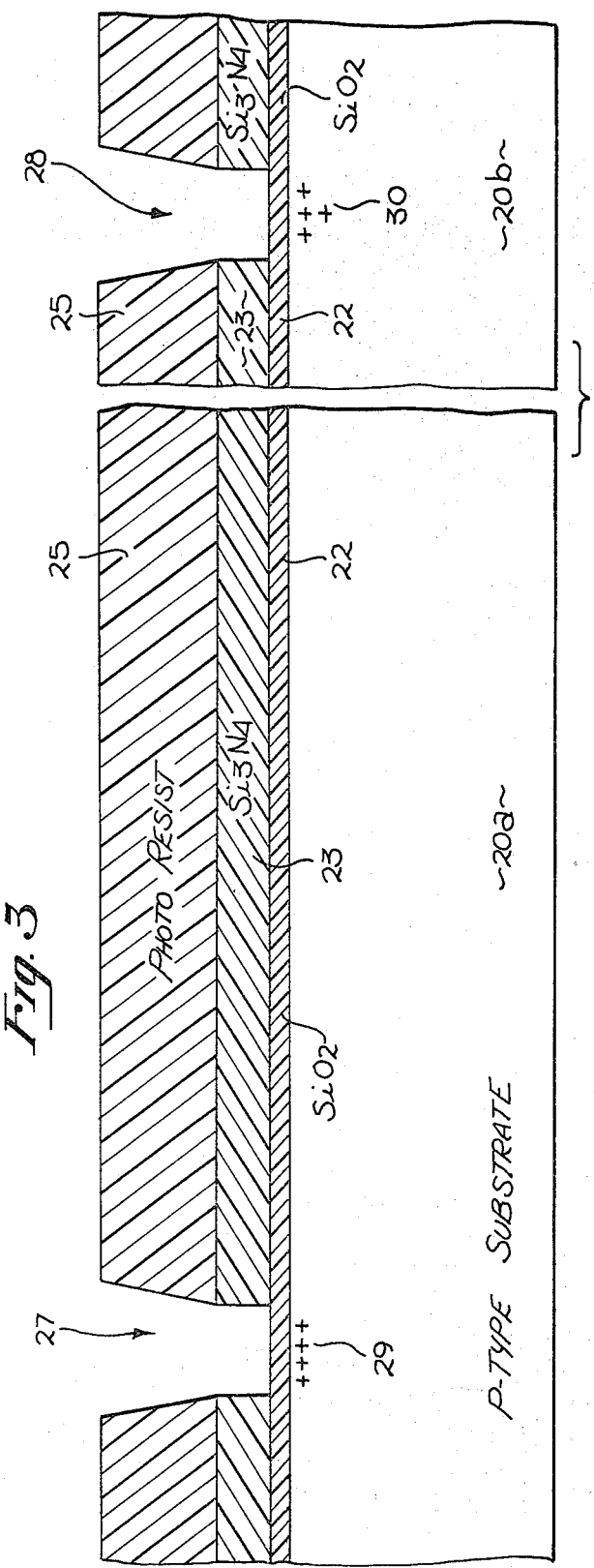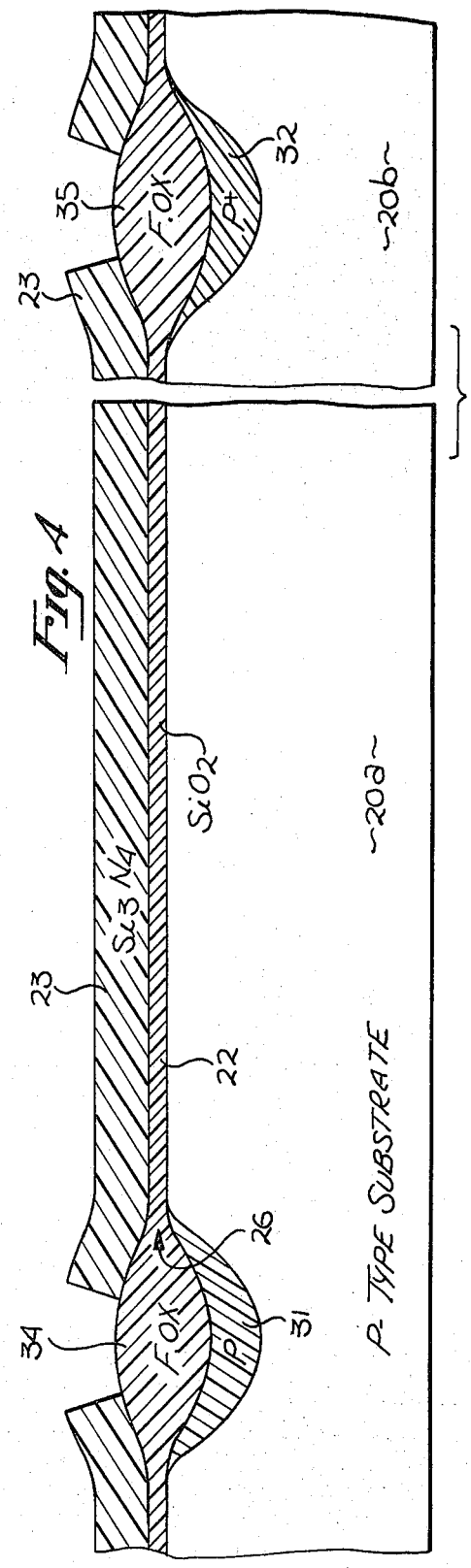

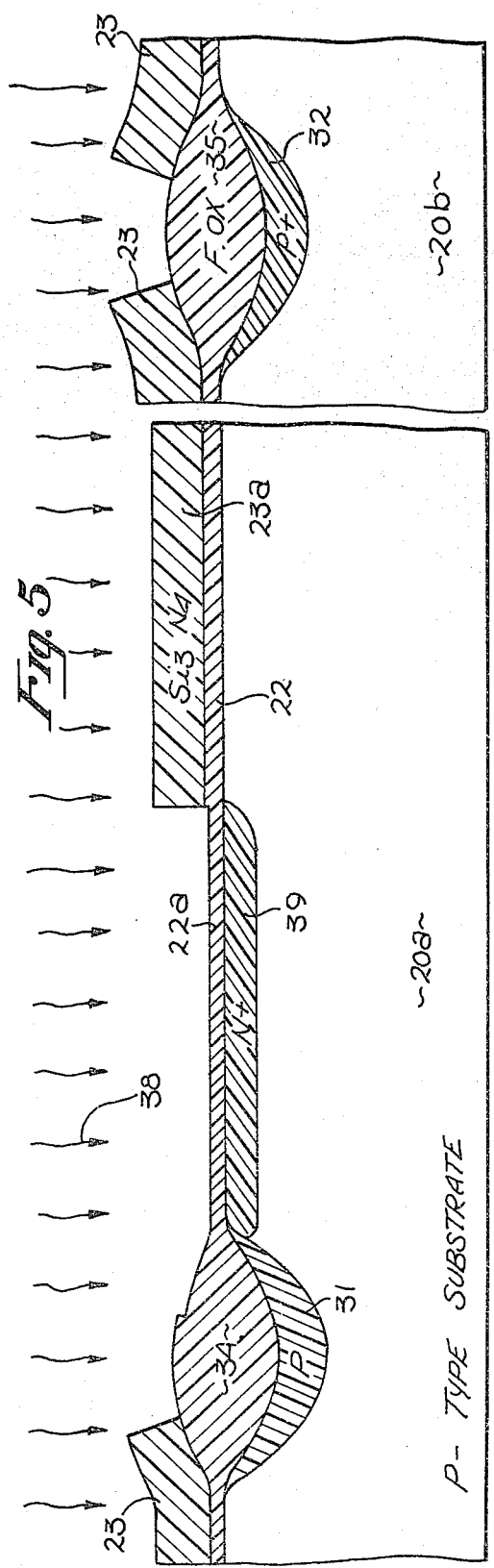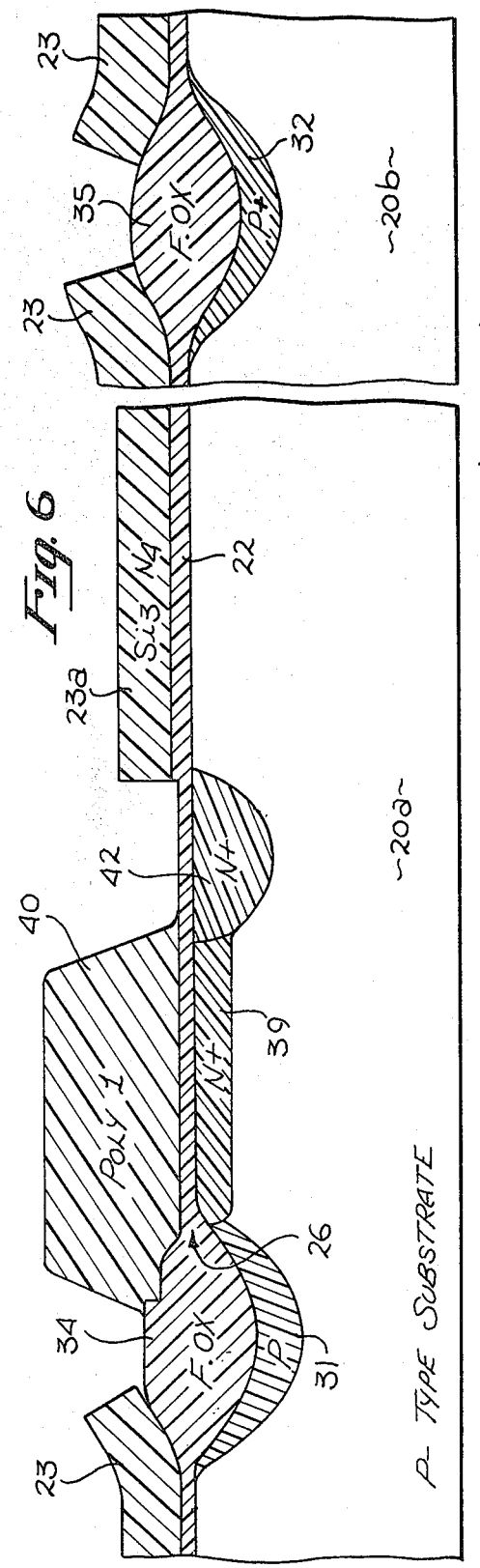

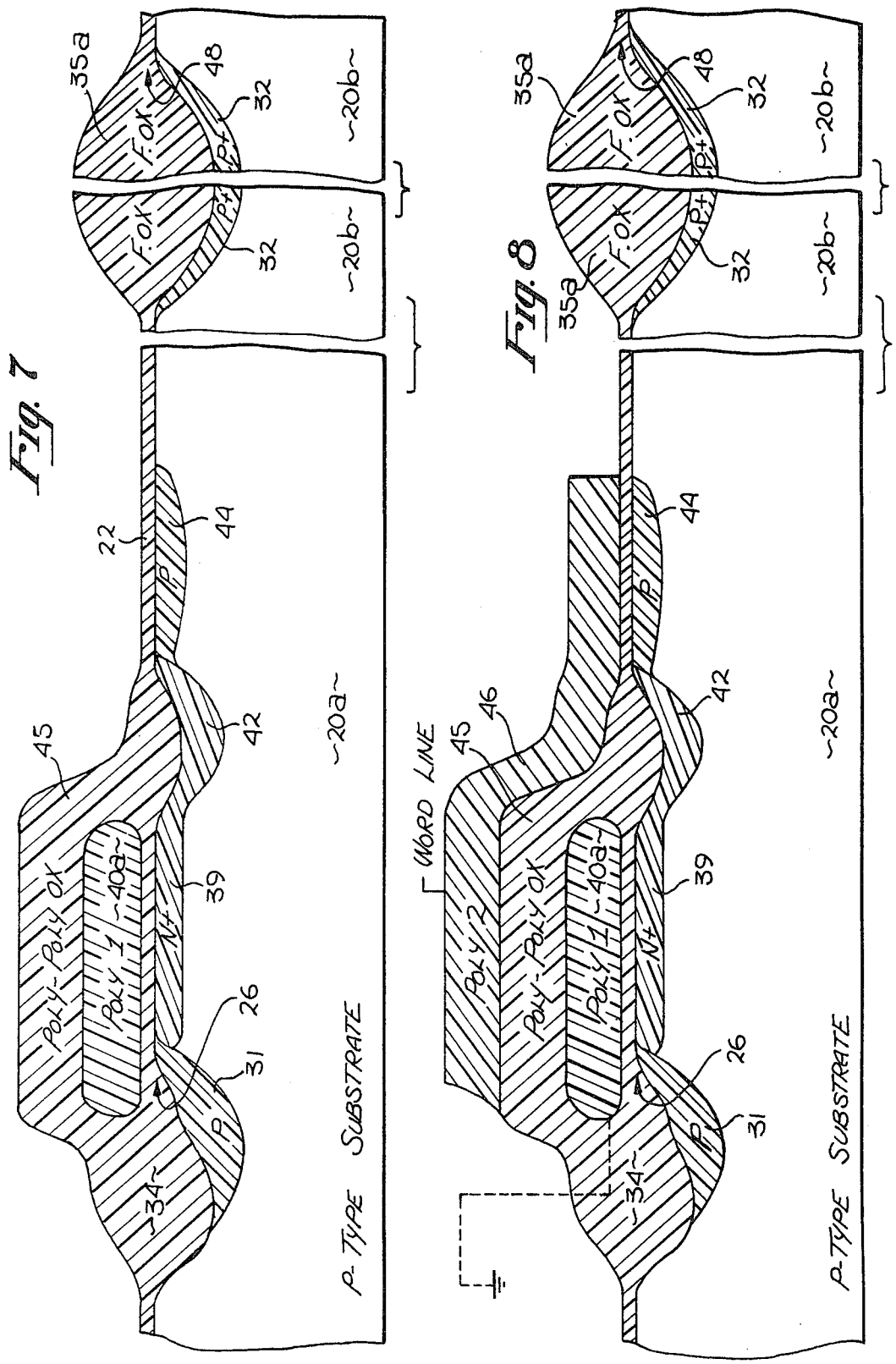

DOUBLE FIELD OXIDATION PROCESS

BACKGROUND OF THE INVENTION

1. Field of the Invention

The invention relates to the field of oxides for integrated circuits, particularly metal-oxide-semiconductor (MOS) circuits.

2. Prior Art

In the fabrication of metal-oxide-semiconductor (MOS) circuits, "front-end" processing is used to form thick field oxide regions at predetermined sites on the substrate. These thick field oxide regions are used primarily for isolation, for example, to prevent parasitic conduction which would otherwise occur when conductive lines cross these regions.

The most common process for forming these field oxide regions employs a silicon nitride layer. Openings are formed in this layer at the predetermined sites and then an oxide is grown on the substrate. The oxide grows primarily at the openings and not at the regions protected by the silicon nitride layer. As the oxide grows it lifts the edges of the silicon nitride layer at the openings. In these areas of lifted silicon nitride, the field oxide becomes thinner, and is generally tapered. These tapered regions are sometimes referred to as "bird-beaks" since, of course, they resemble a bird's beak.

The bird-beak oxide regions, as will be described in more detail in conjunction with FIG. 1, consume substrate area without providing benefits. For example, in the bird-beak region the oxide is generally too thin to provide good field isolation, and yet too thick to be used as part of active devices. In the storage array of a typical random-access memory, considerable storage area is lost because of these tapered regions.

As will be seen, the present invention reduces the size of the bird-beak regions, in the storage array only, thereby reducing the area required for the array.

The invented process is used to fabricate memory cells, each of which includes a field-effect transistor and a storage node. The resultant cell is quite similar to that shown on pages 30 and 31 of the January 27, 1981 edition of *Electronics*. This cell is also described in an article entitled "Circuit Techniques Tune-Up for Production of 64-K RAMs", *Electronic Design*, Oct. 25, 1980, beginning on page 31. However, this cell does not apparently employ the reduced oxide thicknesses in the storage array as taught by the present invention.

SUMMARY OF THE INVENTION

An improved process particularly useful in the fabrication of metal-oxide-semiconductor memory on a silicon substrate where the substrate includes a first area for a storage array, and a second area for peripheral circuits is described. An oxide is grown on the substrate at predetermined first regions in the first area, forming first oxide regions and simultaneously an oxide is grown at predetermined second regions in the second area, forming second oxide regions. These first and second oxide regions are grown to a thickness of approximately 2000 Å to 3000 Å, or less. Polysilicon members are formed in the first area. Then, a second field oxide growing step is employed to grow an oxide on the polysilicon members while simultaneously the second oxide regions are thickened. The memory thus has thinner oxide regions in the storage array (with reduced bird-beaks) and thicker oxide regions for the peripheral circuits. This reduces the area required for the storage array.

BRIEF DESCRIPTION OF THE DRAWINGS

FIG. 3 illustrates the substrate of FIG. 2 after a photoresist layer has been formed over the substrate and openings formed through the photoresist layer and silicon nitride layer.

FIG. 4 illustrates the substrate of FIG. 4 after a field oxide has been grown on the substrate.

FIG. 5 illustrates the substrate of FIG. 4 after a portion of the silicon nitride layer has been removed and during an ion implantation step.

FIG. 6 illustrates the substrate of FIG. 5 after a polysilicon member has been formed on the substrate and after an additional doping step.

FIG. 7 illustrates the substrate of FIG. 6 after a second field oxide growing step and after an additional doping step.

FIG. 8 illustrates the substrate of FIG. 7 after the formation of a second level polysilicon member.

DETAILED DESCRIPTION OF THE INVENTION

A double field oxide process is described which is particularly useful in the fabrication of metal-oxide-semiconductor (MOS) dynamic memories. In the following description, numerous specific details are set forth such as specific conductivity types, and thicknesses, etc., in order to provide a thorough understanding of the invented process. It will be obvious to one skilled in the art, however, that the invention may be practiced without these specific details. In other instances, well-known processing steps have not been described in detail in order not to obscure the present invention in unnecessary detail.

Figure 1:
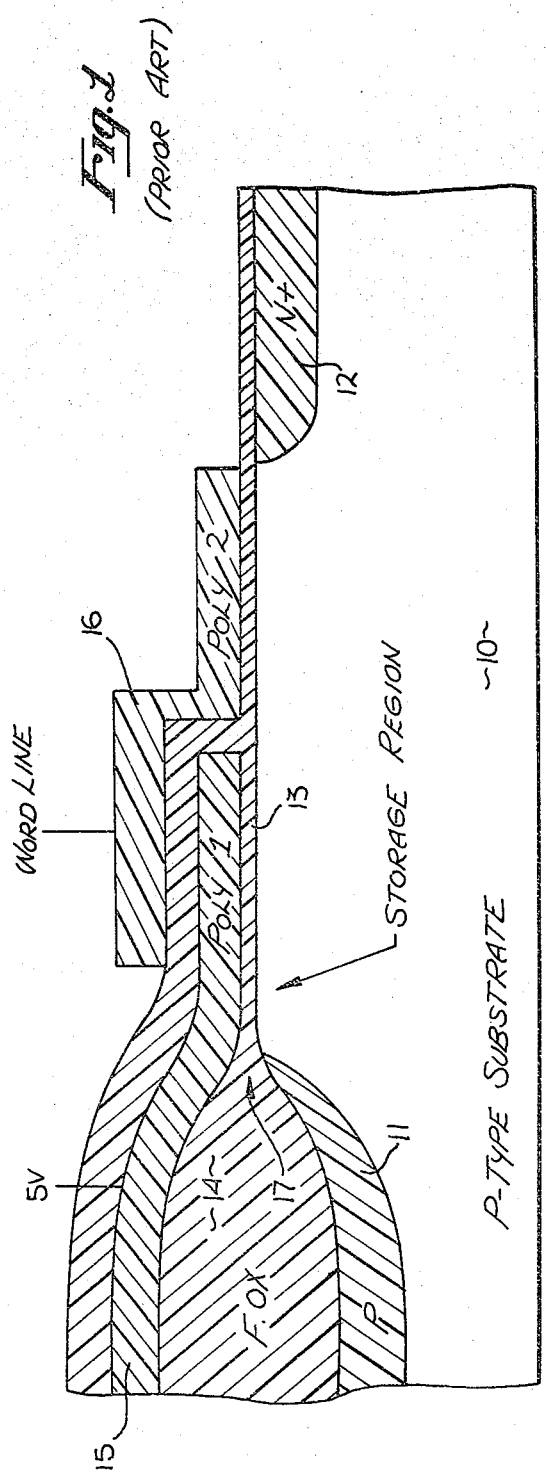
FIG. 1 is a cross-sectional elevation view of a portion of a substrate illustrating a prior art dynamic memory cell.

The portion of the illustrated p-type silicon substrate 10 of FIG. 1 includes a dynamic memory cell which comprises a storage node, or region, and a transistor for accessing the storage region. The storage region 13 is formed by the induced region which results when a potential (five volts) is applied to the polysilicon member 15. The region 13 and region 12 also define source and drain regions for a field-effect transistor. The gate of this transistor is the word line 16. During operation of the memory, a potential is selectively applied to the word line 16 allowing charge to be transferred from the region 12 to the storage region 13, and conversely for allowing charge to be transferred from the storage region 13 to the region 12. The region 12 is coupled to a bit line in the storage array.

During the fabrication of the cell of FIG. 1, field oxide regions such as region 14 are grown. Typically, "channel stop" regions such as region 11 are also formed below the field oxide regions. The field oxide region 14 and the p-type region 11 provide isolation; for example, they prevent parasitic conduction from the region 13 to neighboring regions. The field oxide region 14 is approximately 7000–8000 Å thick, this thickness being sufficient to prevent leakage in a circuit employing five volts.

As illustrated in FIG. 1, a bird-beak region 17 results during the formation of the field oxide region 14. Where the field oxide is 7000–8000 A thick, this tapered region, as illustrated, consumes a considerable amount of substrate area. For this reason, the storage array in a typical MOS dynamic memory is considerably larger than would be necessary if the bird-beak regions 17 were not present.

In the following description, the invented process is described in conjuction with the fabrication of a dynamic, MOS memory cell. Generally, the memory cells are formed in a storage array along with a plurality of bit lines and word lines. The peripheral circuits which communicate with the array, such as input/output amplifiers, sense amplifiers, decoders, timing circuitry, refresh circuitry, etc., for the most part are fabricated in the peripheral area of the substrate. In the cross-sectional elevation view of FIG. 2, a portion 20a of the substrate is assumed to be from the storage array of the memory and the portion 20b of the same substrate is assumed to be from the peripheral area.

Figure 2:
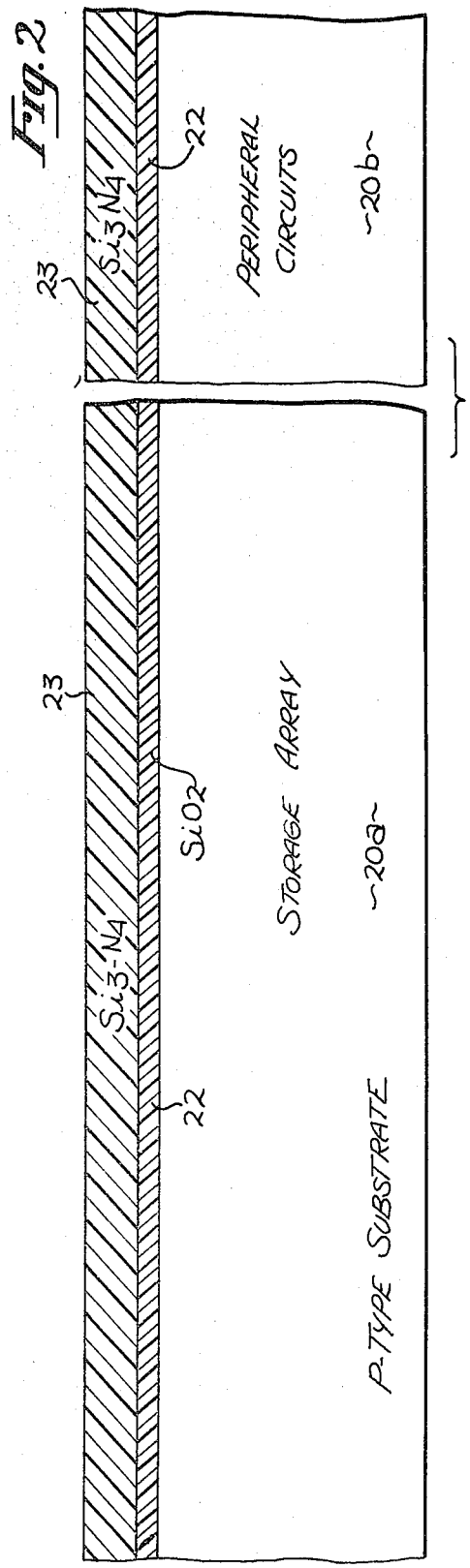
FIG. 2 is a cross-sectional elevation view of two portions of a substrate which are covered with a silicon dioxide layer and silicon nitride layer.

In the presently preferred process, the substrate of FIG. 2 is a monocrystalline silicon substrate doped with a p-type dopant (50 ohm-cm). First a silicon dioxide layer 22 of approximately 400 A thick is grown on the substrate. Following this, a silicon nitride layer 23 which is approximately 1000 A thick is formed over the silicon dioxide layer 22. Both these layers as shown in FIG. 2 are formed over the entire substrate, that is, both in the area designated for the storage array and the area designated for the peripheral circuits.

As shown in FIG. 3, a photoresist layer 25 is now formed over the entire substrate and openings are etched through the photoresist layer and underlying silicon nitride layer 23 at predetermined sites. These sites are the locations of the field oxide regions in the memory, that is, in both the storage array and peripheral circuits. A single opening 27 is shown in FIG. 3 in the storage array, and a single opening 28 is shown in the peripheral circuits. Well-known photolithographic techniques are employed to form these openings, and in the presently preferred embodiment, a plasma etchant is used to etch through the silicon nitride layer 23.

The substrate of FIG. 3 is subjected to ion implantation step to implant boron ions into the openings such as openings 27 and 28. The substrate is thus doped through the silicon dioxide layer 22 as indicated by dopant 29 at opening 27 and dopant 30 at opening 28. In the presently preferred embodiment, a boron implant at an energy level of 70 KeV is employed to obtain a concentration level of approximately $0.5 \times 10^{13}/cm^2$.

Now, as shown in FIG. 4, the substrate is subjected to an oxidation step, for example, by placing it in a wet atmosphere at a high temperature (920 degrees C.). This oxidation step is used to grown an oxide at the openings in the silicon nitride layer to a thickness of approximately 2000–3000 A, however, thinner oxide thicknesses may be used. The resultant structure, as shown in FIG. 4, includes a field oxide region 34 with an underlying channel stop region 31 in the storage array area and a field oxide region 35 with an underlying channel stop region 32 in the peripheral area. Note that this is a departure from most prior art processing where for n-channel transistors employing a five volt power supply, the field oxide is grown to a thickness of 7000–8000 A.

Following this, using ordinary masking and etching steps, a portion of the silicon nitride layer is removed. As shown in FIG. 5 a portion of the layer adjacent to the field oxide region 34 is removed. A portion of the silicon nitride layer, shown as layer 23a, remains on the substrate in the storage array. In the presently preferred process, no silicon nitride is removed in the peripheral area of the substrate at this time. As shown in FIG. 5, the substrate is then subjected to ion implantation as indicated by the lines 38. Arsenic ions are implanted at an energy level of 25 KeV to a concentration level of approximately $5 \times 10^{13}/cm^2$. The field oxide region 34 and silicon nitride layer 23a block this implantation thus, the N+ region 39 is formed in alignment with the region 34 and layer 23a. The ion implantation has no effect on the peripheral area since the ions are blocked either by the silicon nitride layer or the field oxide region 35. Instead of implanting aresenic, an ordinary phosphorus deposition step may be employed.

Following this, the substrate is subjected to a relatively short hydrofluoric acid dip to remove the oxide above the region 39 and then a new gate oxide layer shown as layer 22a is grown on the substrate. In the presently preferred embodiment, this gate oxide layer is approximately 250 A thick.

Now a first layer of polycrystalline silicon (polysilicon) is formed over the entire substrate to a thickness of approximately 5500 A. A low pressure, chemical vapor deposition system is employed. The polysilicon layer is then doped with a phosphorus dopant in an ordinary diffusion step.

Again employing ordinary masking and etching steps, the polysilicon is patterned to form the member 40 shown in FIG. 6. This member extends from the field oxide region 34 almost to the layer 23a. During the etching step all the polysilicon is removed from the peripheral area of the substrate, that is, no polysilicon members are formed in the peripheral circuits from the first layer of polysilicon. A phosphorus implanting step is now used to implant the gap between the polysilicon member 40 and the silicon nitride layer 23a. The N+ region 42 is thus formed. In the presently preferred process, phosphorus is implanted at an energy level of 50 KeV to a concentration level of approximately $2.5 \times 10^{13}/cm^2$. The substrate in the peripheral area is not implanted because it is protected by the silicon nitride layer 23 and field oxide region 35. This phosphorus implant may not be needed particularly if a phosphorus deposition is used for forming region 39.

It should be noted that at this point in the processing, the bird-beak region 26 of FIG. 6 is relatively small when compared to bird beak region 17 of FIG. 1. The reason for this is that the field oxide 34 was grown only to a thickness of 2000–3000 A when compared to the 7000–8000 A for the field oxide region 14 of FIG. 1.

Now the substrate is subjected to an additional field oxidation step, for example, by placing the substrate in a wet atmosphere at a temperature of approximately 920 degrees C. A layer of oxide is formed on all the exposed surfaces of the polysilicon member 40 of FIG. 6 forming the oxide layer 45 shown in FIG. 7. This oxide layer 45 is grown to a thickness of approximately 6000 A. While this oxide is being grown, the field oxide 35 of FIG. 6 also grows, resulting in the field oxide 35a shown in FIG. 7. During the period when the approximately 6000 A of oxide is grown on the polysilicon, approximately 5000 A of additional oxide grows on the field oxide regions of the peripheral circuits. Thus field oxide region 35a is approximately 7000–8000 A thick. The resultant structure is shown in FIG. 7 after removal of the silicon nitride. Note that no oxide growth occurs to the right of region 42 since the substrate was protected by the silicon nitride layer 23a.

The field oxide region 35a can be somewhat thinner than required in prior art circuits. Since much of this oxide is grown later in the processing it has fewer dips, and the same isolation can be achieved with a thinner layer.

Referring to FIG. 7 the bird-beak region 26 did not increase in size during the oxidation step which formed the oxide 45. The reason for this, as may be best seen from FIG. 6, is that the polysilicon member 40 covered region 26 and prevented additional oxidation in this region. In contrast, the field oxide region 35 grew substantially into the field oxide region 35a. The bird-beak 48 of the field oxide region 35a is equivalent to the bird-beak 17 of FIG. 1.

Not shown in the drawings, at this point in the processing in the presently preferred process, a masking step is used to define channel regions in the peripheral circuits for depletion mode transistors. These channel regions are ion implanted with arsenic, which adjusts the threshold voltage for the subsequently formed depletion mode transistors. Also, remaining portions of the exposed layer 22 as shown in FIG. 7 are removed and a new oxide regrown to a thickness of approximately 400 A.

Using an ordinary masking step, the region 44 of FIG. 7 is defined. Simultaneously, (not shown) channel regions are defined in the peripheral circuits for enhancement mode transistors. The substrate is then subjected to a boron implant to adjust the threshold voltage for these n-channel, enhancement mode devices and to form region 44. In the presently preferred embodiment, the substrate is implanted at an energy level of 50 KeV to a concentration level of $0.55 \times 10^{12}/cm^2$.

Now a second layer of polysilicon is deposited over the entire substrate. This polysilicon layer as was the case for the first level of polysilicon is doped with phosphorus. An ordinary masking and etching step is used to define members from this polysilicon layer such as the word line 46 of FIG. 8. Not shown, simultaneously with the formation of word line 46 numerous other circuit elements are formed such as gate members for transistors in the peripheral circuits.

Next an arsenic implant is used to define the source and drain regions for the transistors. As currently preferred, arsenic is implanted an an energy level of 60 KeV to a concentration level $3 \times 10^{15}/cm^2$ forming, by way of example, region 47 of FIG. 8 (not shown) in alignment with word line 46.

Well-known "back end" steps are used to complete the memory including the formation of protective layers over the circuit elements.

In many n-channel MOS circuits, a five volt power supply is used. A field oxide of approximately 7000–8000 A thick is needed to provide isolation for this voltage. The field oxide 35a of FIG. 8 is thus thick enough to allow all the peripheral circuits to operate at five volts. (Also this thicker oxide can be used in regions of the storage array where needed.) The field oxide 34, however, being somewhat thinner, will not provide isolation if the first layer of polysilicon is coupled to five volts as was the case in FIG. 1. Rather, as shown in FIG. 8, the polysilicon member 40a is coupled to ground. This prevents the formation of the induced region 13 shown in FIG. 1, and required the formation of the doped region 39 shown in FIG. 8.

The memory cell of FIG. 8 operates in the same manner as the memory cell of FIG. 1, that is, when a potential is applied to the word line 46 charge may be transferred between the region 47 and the storage region (regions 39 and 42) through the channel region 44.

Since the bird-beak 26 of FIG. 8 is substantially smaller than the bird-beak 17 of FIG. 1, much more of the substrate area can be used for storage.

Another advantage results from the cell of FIG. 8 when compared to the cell of FIG. 1. It is not uncommon to include redundant rows and/or columns in a random-access memory which are used to replace faulty rows or columns. Referring to the cell of FIG. 1, assume that defective oxide exists between word line 16 and the member 15. This defect will prevent the use of redundant rows or columns since word line 16 is permanenttly coupled to five volts thereby permanently coupling all the storage regions such as storage region 13 to their respective bit lines. This permanently imbalances all the bit lines. On the other hand, with the member 40a of FIG. 8 coupled to ground, a short through the oxide 45 effectively couples the word line 46 to ground and decouples the storage nodes along the word line from the bit lines. This allows the use of a redundant word line and associated cells.

Thus, a double field oxidation process has been described which provides thinner field oxide regions with small bird-beaks in the storage array and thicker field oxide regions for the peripheral circuits. Since the plates associated with the storage regions are coupled to ground, the thinner field oxides in the storage array area provide sufficient isolation.

I claim:

1. In the fabrication of a metal-oxide-semiconductor memory on a silicon substrate which substrate includes a first area for a storage array and a second area for peripheral circuits, an improved process comprising the steps of:

growing an oxide on said substrate at predetermined first regions of said first area forming first oxide regions and simultaneously growing an oxide at predetermined second regions of said second area forming second oxide regions, said first and second oxide regions being grown to a thickness of approximately 3000 A, or less;

forming polysilicon members on said substrate in at least said first area of said substrate;

growing an oxide on said polysilicon members in said first area while simultaneously thickening said second oxide regions;

whereby a memory is fabricated having thinner oxide regions in the storage array and thicker oxide regions for the peripheral circuits, thereby reducing the area required for the storage array.

2. The process defined by claim 1 wherein said first regions and second regions are defined by openings in a silicon nitride layer.

3. The process defined by claim 2 wherein said polysilicon members extend over portions of said first oxide regions and prevent the thickening of said portions of said first oxide regions during said growing of an oxide on said polysilicon members.

4. The process defined by claim 3 wherein said substrate is doped at said openings prior to said growing of said first and second oxide regions.

5. The process defined by claim 4 including the step of doping said substrate beneath said polysilicon members.

6. The process defined by claim 3 wherein said second oxide region is thickened to a thickness of approximately 7000 A–8000 A.

7. In the fabrication of a metal-oxide-semiconductor memory on a silicon substrate where first field oxide regions are used in the storage array for isolation and second field oxide regions are used in the peripheral circuits for isolation, an improved process for forming said first and second oxide regions comprising the steps of:

forming openings through a silicon nitride layer at the proposed sites of said first and second oxide regions;

growing an oxide on said substrate to a thickness of approximately 3000 A, or less;

removing at least a portion of said silicon nitride layer at said first oxide regions;

forming polysilicon members which extend over portions of said first oxide regions, generally where said removal of said silicon nitride has occurred;

growing an oxide on said polysilicon members while thickening said second field oxides;

whereby a memory is fabricated having thinner field oxide regions in the storage array and thicker oxide regions for the peripheral circuits, thereby reducing the area required for the storage array.

8. The process defined by claim 7 wherein said second field oxide is thickened to a thickness of approximately 7000 A–8000 A or thicker.

9. The process defined by claim 7 wherein said substrate is doped at said openings prior to growing said oxide.

10. The process defined by claim 9 including the step of doping the substrate below said polysilicon members.

11. The process defined by claim 7 wherein said polysilicon members are formed from a layer of polysilicon which is approximately 5500 A thick.

12. The process defined by claim 7 wherein said growing of said oxide on said polysilicon members continues to an oxide thickness of approximately 5000 A–6000 A.

* * * * *